(12) United States Patent
Hood, III et al.

(10) Patent No.: US 8,046,206 B1
(45) Date of Patent: Oct. 25, 2011

(54) METHOD AND SYSTEM USING SUBGRAPH ISOMORPHISM TO CONFIGURE HARDWARE RESOURCES

(75) Inventors: Frederick R. Hood, III, Auburn, WA (US); Kenneth Y. Ogami, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1189 days.

(21) Appl. No.: 10/260,129

(22) Filed: Sep. 27, 2002

(51) Int. Cl.
*G06F 17/50* (2006.01)
*G06F 9/455* (2006.01)

(52) U.S. Cl. .............................. 703/13; 703/14; 716/106

(58) Field of Classification Search ................ 703/6, 13, 703/14; 716/106
See application file for complete search history.

(56) References Cited

U.S. PATENT DOCUMENTS 6,550,042 B1 * 4/2003 Dave ................................. 716/5
6,574,779 B2 * 6/2003 Allen et al. ........................ 716/1
6,754,882 B1 * 6/2004 Sanchez et al. ................. 716/15
6,782,511 B1 * 8/2004 Frank et al. ........................ 716/1

OTHER PUBLICATIONS

Gopalakrishnan et al., Direct Transistor-Level Layout for Digital Blocks, 2001, IEEE, Proceedings of the 2001 IEEE/ACM international conference on Computer-aided design, pp. 577-584.*

Olrich et al. "SubGemini: Identifying SubCircuits using a Fast Subgraph Isomorphism Algorithm", 1993, ACM/IEEE Design Automation Conference, pp. 31-37.*
Kory Hopkins; "Definition"; Jan. 16, 1997; http: // www.cs.sfu.ca/cs/people/GradStuden...sonal/papers/graph_isomorphism/node2.html.
C. Ebeling et al.; "Validating VLSI Circuit Layout by Wirelist Comparison"; Sep. 1983; In proceedings of the IEEE International Conference on Computer Aided Design (ICCAD-83), pp. 172-173.
"The Gemini Netlist Comparison Project"; http://www.cs.washington.edu/research/projects/lis/www/gemini/gemini.html,larry@cs.washington.edu.
Ohlrich et al.; "Sub-Gemini: Identifying Subcircuits Using a Fast Subgraph Isomorphism Algorithm"; Jun. 1993; In proceedings of the 30th IEEE/ACM Design Automation Conference.
Ebeling; "Gemini II: A Second Generation Layout Validation Program"; 1988; In proceedings of the IEEE International Conference on Computer Aided Design (ICCAD-88), pp. 322-325.

* cited by examiner

*Primary Examiner* — Kamini S Shah
*Assistant Examiner* — Suzanne Lo (57) ABSTRACT

A method of defining a configuration of hardware resources, using a subgraph isomorphism process. The method executes a subgraph isomorphism process to discover possible resources in a hardware resource space that are suitable to implement a function. The hardware resource space may be defined by a target graph and the function may be defined by a subgraph. Next, the target graph is annotated to establish configuration settings for selected resources of the possible resources. The configuration settings may be established based on the subgraph mapping to the target graph. The target graph may also be annotated to specify parameters for the selected resources. This annotation may be performed in response to receiving parameters for the function.

10 Claims, 7 Drawing Sheets

METHOD AND SYSTEM USING SUBGRAPH ISOMORPHISM TO CONFIGURE HARDWARE RESOURCES

FIELD OF THE INVENTION

The present invention relates to the field of configuring programmable hardware resources. Specifically, embodiments of the present invention relate to a method and system that use a subgraph isomorphism process to define a configuration of hardware resources.

BACKGROUND ART

A graph isomorphism process is a procedure for determining whether one graph is equivalent or isomorphic to another; for example, whether there exists a bijective mapping from one graph to another. A subgraph isomorphism process is a procedure for determining whether one graph (e.g., a subgraph) is contained within another graph; for example, whether there exists a subset of the target graph that is isomorphic to the subgraph. In the latter case, the bijective mapping of the subgraph to the subset of the target graph is also an injective morphism from the subgraph to the target graph.

Existing applications of graph isomorphism processes and subgraph isomorphism processes seek principally to answer the question of equivalence by finding a bijective mapping from one graph to another graph or to some subset of another graph. If no mapping exists, then differences between the graphs may be presented such that modifications may be made to make such a mapping possible.

A conventional program using a graph isomorphism process is the Gemini program. (See e.g., C. Ebeling and O. Zajicek, "Validating VLSI Circuit Layout by Wirelist Comparison," Proceedings of the Conference on Computer Aided Design (ICCAD), pp 172-173, 1983.) The Gemini program first models circuits as graphs having nodes (vertices). Devices (e.g., transistors) are represented as device nodes, and the interconnections (e.g., wires) are represented as net nodes. The net nodes link together the device nodes. An application of Gemini is to form one graph for a wirelist that is extracted from a layout and another graph from a specification wirelist. The Gemini program then runs a graph isomorphism process to compare the two graphs and reports if they are exactly the same. If they are not the same, the program may report differences between the underlying circuits. A typical use of this program is to determine whether a VLSI circuit layout is correct and to report differences as errors.

Another conventional program seeks to find subcircuits in a larger circuit. For example, SubGemini is a program that uses a subgraph isomorphism process to find subcircuits in a larger circuit. (See e.g., M. Ohlrich, C. Ebeling, E. Ginting, and L. Sather, "SubGemini: Identifying SubCircuits Using a Fast Subgraph Isomorphism Algorithm", Proceedings of the 30th ACM/IEEE Design Automation Conference, pp 31-37, 1993.) This may be useful to identify a related group of primitive resources that function as a higher level device. For example, a common problem that this conventional program seeks to solve is converting a transistor netlist into a gate netlist.

However, such conventional techniques using graph or subgraph isomorphism processes do not seek to determine if there are multiple ways in which the first circuit maps onto the second circuit. Thus, these conventional techniques are not designed to determine optimal solutions.

Furthermore, the target circuit to which the mapping is being done is considered to be static. For example, there is no provision for modifying the target circuit to accommodate the circuit that is being mapped to it. Thus, existing techniques do not provide a means to map to a programmable hardware resource space.

SUMMARY OF THE INVENTION

Therefore, it would be advantageous to provide a method and system for establishing a configuration of a programmable hardware resource space for implementation on an integrated circuit. It would also be advantageous to provide a way to order possible allocation of resources. It would also be advantageous to provide a mapping method that allows underlying programmable hardware circuits to be programmed to meet a specified configuration. It would be further advantageous to provide a mapping method that allows resource parameters to be established.

Embodiments of the present invention provide a method and system of defining a configuration of hardware resources for an integrated circuit device. Embodiments of the present invention provide a method and system that orders possible allocations of resources. Embodiments of the present invention provide a method and system that allow resource parameters to be established by a user. Embodiments of the present invention are suitable for underlying hardware that is programmed to meet a specified configuration. The benefits described above may be implemented in a design tool that allows circuit designers to program and design an integrated circuit design that can be programmed (e.g., realized) into a programmable integrated circuit device. In one embodiment, the programmable resources are a programmable microcontroller, but could be any hardware device. Embodiments of the present invention provide these advantages and others not specifically mentioned above but described in the sections to follow.

A method of defining a configuration of hardware resources using a subgraph isomorphism process is disclosed. The method executes a subgraph isomorphism process to discover possible resources in a hardware resource space that are suitable to implement a function. The hardware resource space may be defined by a target graph and the function may be defined by a subgraph. Next, the target graph is annotated to establish configuration settings for selected resources of the possible resources. The configuration settings may be established based on the subgraph mapping to the target graph. The target graph may also be annotated to specify parameters for the selected resources. This annotation may be performed in response to receiving parameters for the function.

Another embodiment provides a computer system for configuring a hardware resource space, using a subgraph isomorphism process. The computer system has a computer readable medium having stored thereon a target graph describing a hardware resource space and a plurality of subgraphs describing functions. The computer system further has a processor to perform a subgraph isomorphism process to determine at least one embedding for a subgraph in the target graph. In this fashion, a possible resource in the hardware resource space is located for a function.

DETAILED DESCRIPTION OF THE INVENTION

In the following detailed description of the present invention, a method and system for configuring a hardware resource space using a subgraph isomorphism process, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "executing" or "annotating" or "mapping" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Using Subgraph Isomorphism to Configure Hardware Resources

Figure 1:
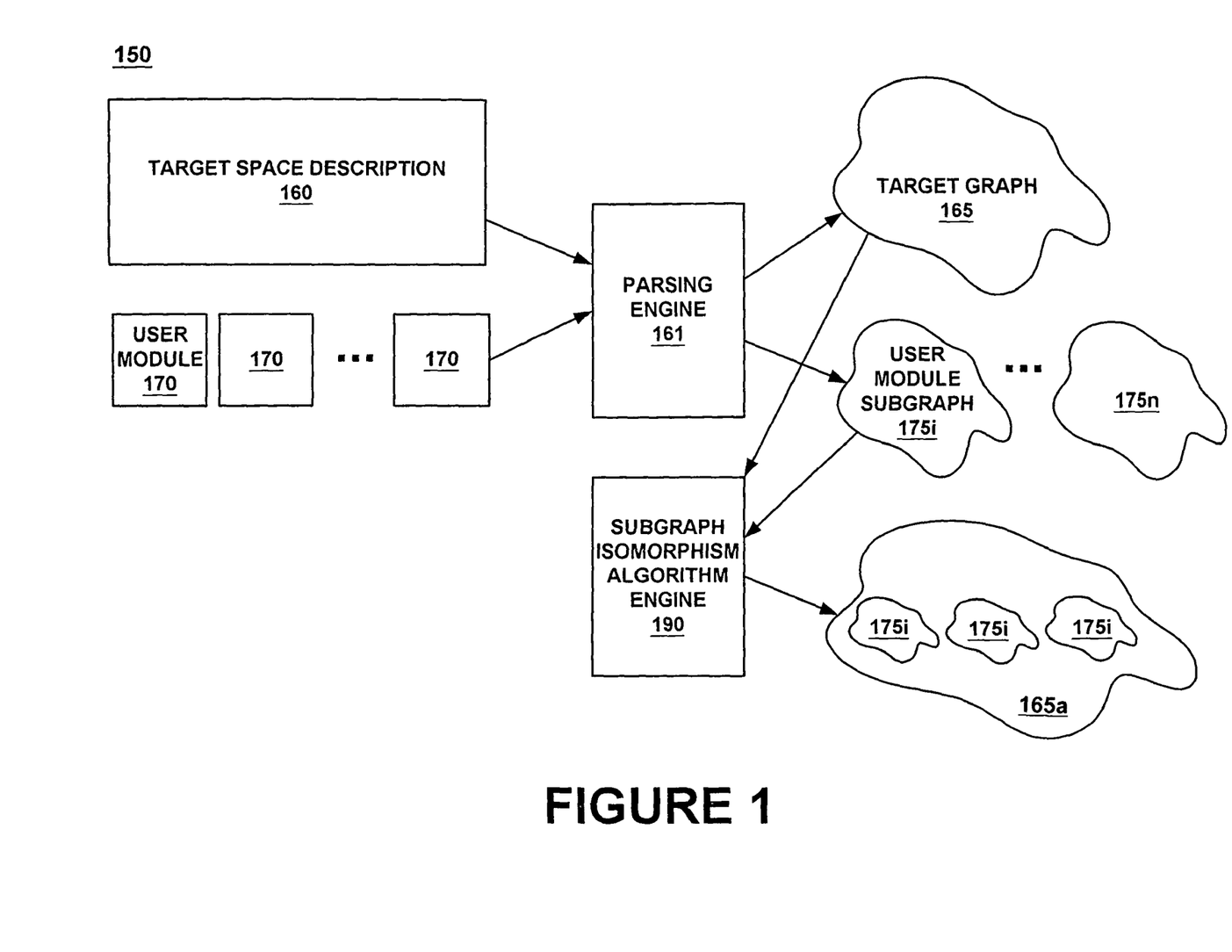
FIG. 1 is a block diagram illustrating a system for configuring a hardware resource space, according to an embodiment of the present invention.

FIG. 1 illustrates a diagram of a system 150 for configuring a hardware resource space, using a subgraph isomorphism process according to various embodiments of the present invention. The system 150 comprises a target space description 160, which may describe the hardware resource space. A hardware resource may be defined as an arbitrary set of physical semiconductor features that perform a specific analog or digital transformation of inputs to outputs. The inputs and outputs may consist of electric fields, currents, voltages, quantum states, magnetic fields and domains, electromagnetic waves and particles, as well as changes in position, tension, compression, or torsion of mechanical structures fabricated as part of the semiconductor device. The target space description 160 may be, for example, an XML (Extensible Markup Language) description of at least a portion of a hardware resource space that is of interest. In one embodiment, the hardware resource space is a programmable system on a chip and the target space description 160 is an XML description of this space. However, embodiments of the present invention are not limited to using XML as the hardware description language nor to the hardware resource space being a programmable system on a chip. The system can be used by designers of a circuit design for implementing the circuit design of an integrated circuit device or product.

The system 150 also comprises a number of user modules 170, which may describe functions that may be implemented in the hardware resource space. For example, user modules 170 may contain descriptions that are used to program the hardware resource space to implement functions such as timers, digital-to-analog converters (DAC), analog-to-digital converters (ND converter), etc. Thus, the hardware resources may be configurable hardware resources. A configurable hardware resource may be a hardware resource with transformational behavior that may be altered by changing the content of storage elements (such as various types of RAM, flash and PROM memory) provided specifically for that purpose. For example, an input multiplexer transforms its set of inputs to an output by propagating only one of them to that output. If the selection of one input over another is determined by a configuration storage element rather than one of its inputs, it may be termed a configurable multiplexer.

Similar to the target space description 160, the user modules 170 may be implemented as an XML description. However, any convenient description technique, such as, for example, VHDL or verilog, may be used. A user module 170 may define which resources in the hardware resource space (and thus in the target space description 160) are needed to implement the function of the user module 170. The user module 170 may also define how the resources need to be configured. For example, the user module 170 may define how various resources are to be connected.

In various embodiments of the present invention, a user may select among various user modules 170 and place them onto a graphical user interface that describes an underlying hardware resource space. The user may then set parameters, such as an amplifier's gain. Embodiments of the present invention use a subgraph isomorphism process to facilitate this process. Those of ordinary skill in the art will recognize that this process may be applied to configuring other hardware resource spaces and is not limited to placing user modules 170 as described herein.

Details relating to a PSoC™ architecture (programmable systems on a chip) are described in co-pending U.S. patent application Ser. No. 09/989,570, filed Nov. 19, 2001, entitled "METHOD FOR FACILITATING MICROCONTROLLER PROGRAMMING," by Bartz et al., assigned to the assignee of the present invention and incorporated herein by reference. However, embodiments of the present invention are not limited to the configurable architecture described therein.

Still referring to FIG. 1, the system 150 may also have a parsing engine 161 to parse the target space description 160 and the user modules 170 to create a target graph 165 and user module subgraphs 175i-175n, respectively. The target graph 165 and user module subgraphs 175 may comprise nodes and arcs and may be suitable to apply a subgraph isomorphism process thereto.

The system 150 has a subgraph isomorphism process engine 190 that applies subgraph isomorphism process to the target graph 165 and a particular subgraph 175i. In so doing, embodiments of the present invention provide a list of all possible placements for a user module subgraph 175 in a target graph 165. Referring to the lower right corner of FIG. 1, several subgraphs 175i are shown on exemplary target graph 165a. This illustrates that the target graph 165a has suitable resources for the subgraphs 175i at those placements.

A user module subgraph 175 may be able to claim a portion of a target graph (e.g., 165, 165a, etc.). In making a claim, a portion of the resources described by the target graph (e.g., 165, 165a, etc.) may be assigned to the user module subgraph 175. For example, if the user module subgraph 175 is for a DAC, the claim may comprise two particular PSoC™ blocks in a PSoC™ architecture.

Figure 2:
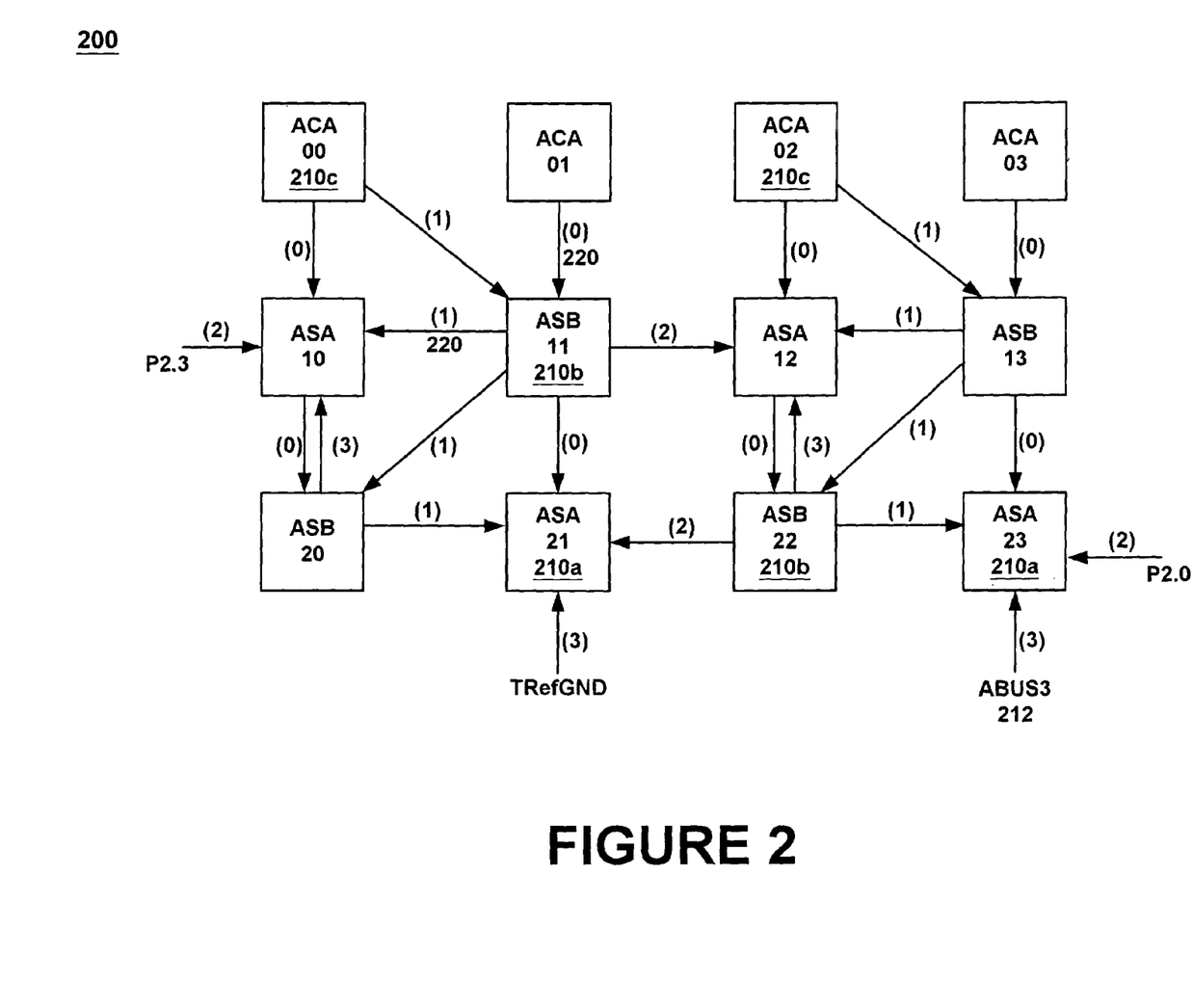
FIG. 2 is an exemplary hardware resource space, which embodiments of the present invention configure.

FIG. 2 is a block diagram illustrating a portion of an exemplary hardware resource space 200. In this example, the hardware resource space 200 is part of a PSoC™ architecture. A PSoC™ architecture may comprise programmable analog and digital blocks, multiplexers, busses, switches, inverters, pins, output drivers, clock dividers, multipliers, decimators, etc. However, embodiments of the present invention are not limited to the hardware resource space 200 being programmable system on a chip.

The blocks 210 in FIG. 2 represent analog PSoC™ blocks 210, which are just a portion of the hardware resource space. PSoC™ blocks 210 may be user configurable system resources. Analog PSoC™ blocks 210 may be configured to provide a wide variety of peripheral functions. PSoC™ Designer Software Integrated Development Environment commercially available from Cypress Microsystems of Bothell, Wash. provides automated configuration of PSoC™ blocks 210 by selecting desired functions. For example, user modules 170 are selected and placed onto a graphical user interface showing hardware resources. FIG. 2 shows twelve analog PSoC™ blocks 210 that may be used separately or combined with digital PSoC™ blocks (not shown).

In FIG. 2 there are three types of analog PSoC™ blocks 210: continuous time blocks 210c (ACA), type A switch capacitor blocks 210a (ASA), and type B switch capacitor blocks 210b (ASB). The analog blocks 210 may be referenced by their row and column position. ACA blocks 210c may provide continuous time analog functions. ASA blocks 210a and ASB blocks 210b may provide ND converter and DAC analog functions. Exemplary analog functions are 12-bit incremental and 11-bit Delta-Sigma A/D converter, successive approximation A/D converters, DACs, programmable gain stages, sample and hold circuits, programmable filters, comparators, etc. Thus, depending on the type of function that a user module 170 is to implement, the subgraph isomorphism process will determine which PSoC™ blocks 210 are suitable. Further, all possible placements may be provided for the user to select from.

Each of the analog PSoC™ blocks 210 may have many potential inputs and several outputs. FIG. 2 shows a few of the possible connections 220 between analog PSoC™ blocks 210. However, many more connections are possible, but not shown to avoid clutter. In one embodiment, the selection of which of the possible connections that are realized may be established by multiplexers that are selected by bits in registers. In turn, the registers may be programmed in accordance with how the target graph 165 is annotated.

FIG. 2 shows only a few of the connections between blocks 210. For example, the connections may correspond to possible connections that may be established with one of many multiplexers within each block 210. The connections may be arcs or net nodes of the target graph 165. One of ordinary skill in the art will recognize that the connections may be modeled as either arcs or net nodes. Throughout this description, the term arc may include a net node having arcs to nodes describing resources. Exemplary inputs to the analog blocks 210 may include analog signals from external sources, intrinsic analog signals driven from neighboring analog blocks 210 or various voltage reference sources. There may be several discrete outputs from each analog block 210: 1) an analog output bus (ABUS) 212, which is an analog bus resource that is shared by all of the analog blocks 210 in a column, 2) a comparator bus, which is a digital bus resource that may be shared by all of the analog blocks 210 in a column, and 3) an output bus, which is an analog bus resource that may be shared by all of the analog blocks 210 in a column and connects to one of the analog output buffers, to send a signal externally to the device. There may also be intrinsic outputs that connect to neighboring analog blocks 210.

Embodiments of the present invention program the analog blocks 210 by setting the values the registers that configure the analog blocks 210. The values in the registers may be set by annotating the target graph 165. As discussed herein, this annotation may occur as a result of a user module subgraph 175 being placed onto the target graph 165 and also by a user inputting parameters.

As an example, the analog continuous time (ACA) PSoC™ blocks 210c may be built around an operational amplifier. There may be several analog MUXes that may be controlled by register-bit settings in the control registers that determine the signal topology inside the analog ACA block 210c. There may also be a precision resistor matrix that is located in the feedback path for the op-amp, which may be controlled by register-bit settings. There may also be an analog comparator connected to an output, which converts analog comparisons into digital signals. Other analog blocks 210 and digital blocks may be configured in a similar fashion. Further, embodiments of the present invention may configure resources other than analog blocks 210 and digital PSoC™ blocks.

The portion of the hardware resource space that is shown in FIG. 2 may also be conceptualized as representing a target graph 165. The analog blocks 210 may be modeled as nodes of the target graph 165. The interconnections 220 may be modeled as arcs or net nodes. However, nodes of the target graph 165 do not have to correlate directly to analog blocks 210 in the target space. A node may be an entire block 210, multiple analog blocks 210, or a portion of an analog block 210. Further, nodes 210 are not limited to representing programmable analog blocks 210 or digital blocks, as they may be any hardware resource. The arcs between nodes may describe potential connections, as opposed to actual connections. The arcs may be annotated to describe whether the potential connection has in fact been established. Furthermore, an arc may annotated to identify the net to which it belongs.

Thus, embodiments of the present invention abstract away from the transistor level and focus on resources that may be claimed. For example, a user module 170 may claim a resource by a user module subgraph 175 mapping to the target graph 165.

Embodiments of the present invention can modify certain elements of the target graph 165. The modifications may be performed by annotating the target graph 165. This may correspond to changing the function of selected resources in the hardware resource space. For example, PSoC™ blocks 210 may be configured to perform a specific function by setting the values in the registers associated with the PSoC™ blocks 210.

Figure 3:
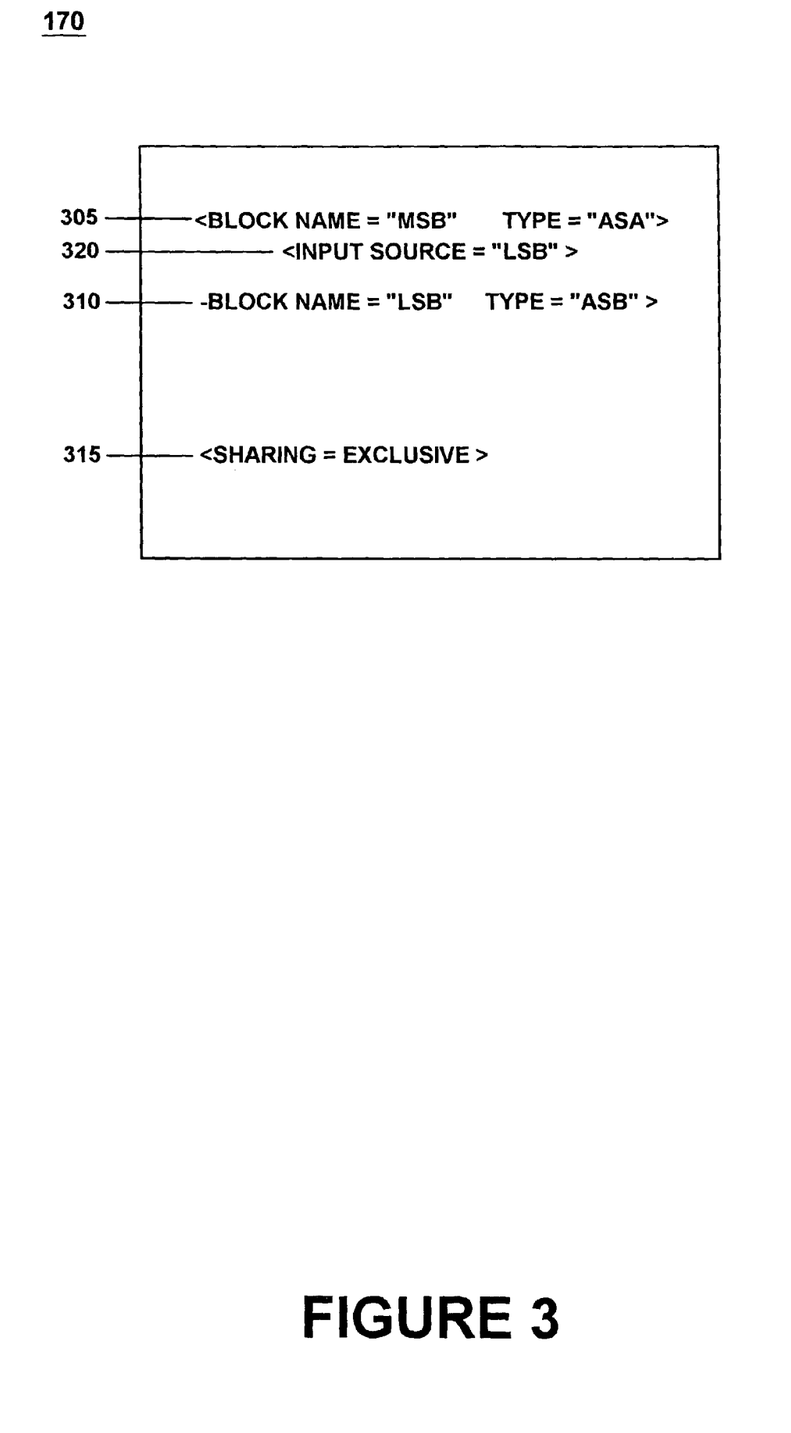
FIG. 3 illustrates a simplified exemplary user module, according to an embodiment of the present invention.

FIG. 3 is a simplified exemplary user module 170. A description for the user module 170 may be implemented in XML, although other descriptive languages are possible. The user module 170 may have information that may be used to annotate the target graph 165. For example, the user module 170 may claim at least one resource in the hardware resource space. However, the user module 170 may share this resource. The user module 170 may have embedded therein information describing the sharing status of resources that it claims. Examples of such sharing status may be a sharing tag 315 having one of the following attributes sharing="none", sharing="exclusive", sharing="sequential", sharing="unrestricted". This information may be used to annotate the target graph 165 in a position in which the user module subgraph 175 embeds, upon selecting that position as an actual placement. In this fashion, some of the resources used by the just placed user module subgraph 175 may be shared with a previous placed or later placed user module subgraph 175.

Referring to the listing in FIG. 3, the tag 305 with block name=MSB has an attribute of "ASA". This may indicate that a type A switched capacitor block 210a is required for implementation. The tag 310 with block name=LSB has an attribute of "ASB". This may indicate that a type B switched capacitor block 210b is required. The tag 320 Input Source=LSB may indicate the connection between the two analog blocks 210.

Figure 4A:
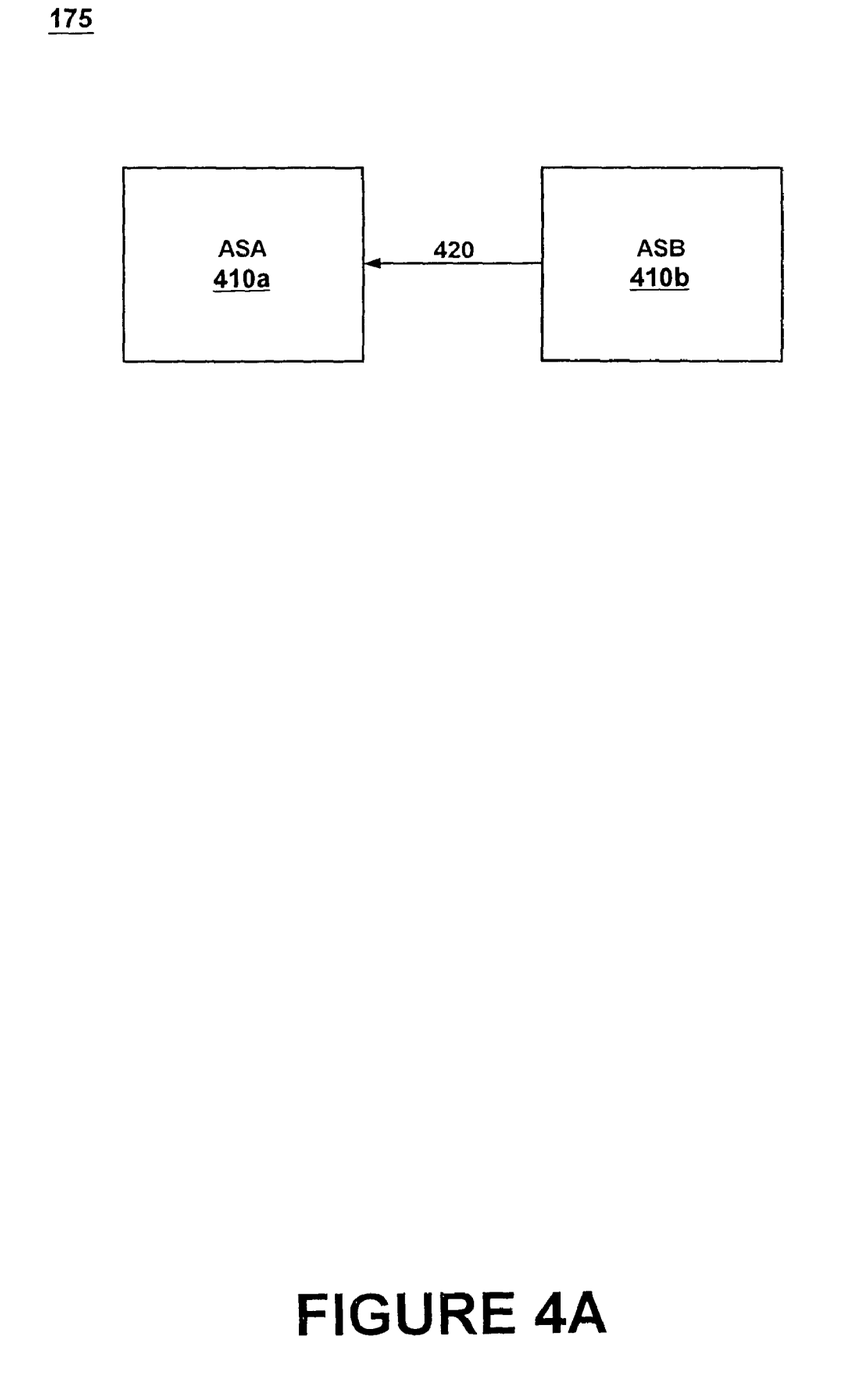
FIG. 4A and FIG. 4B are simplified graphical representations of the user module of FIG. 3, according to embodiments of the present invention.

FIG. 4A is a graphical illustration of a user module subgraph 175. In this example, the user module subgraph 175 has a node 410a for an ASA analog block 210a connected to a node 410b for an ASB analog block 210b with an arc 420. In this case, the two analog blocks 210 are horizontal to one another. However, the choice of which is on the right or left may be arbitrary. The subgraph 175 of FIG. 4A may map to the hardware resource space in four different locations. Referring again to FIG. 2, it may map to the following pairs (ASA10, ASB11), (ASA12, ASB13), (ASB20, ASA21), (ASB22, ASA23).

Figure 4B:
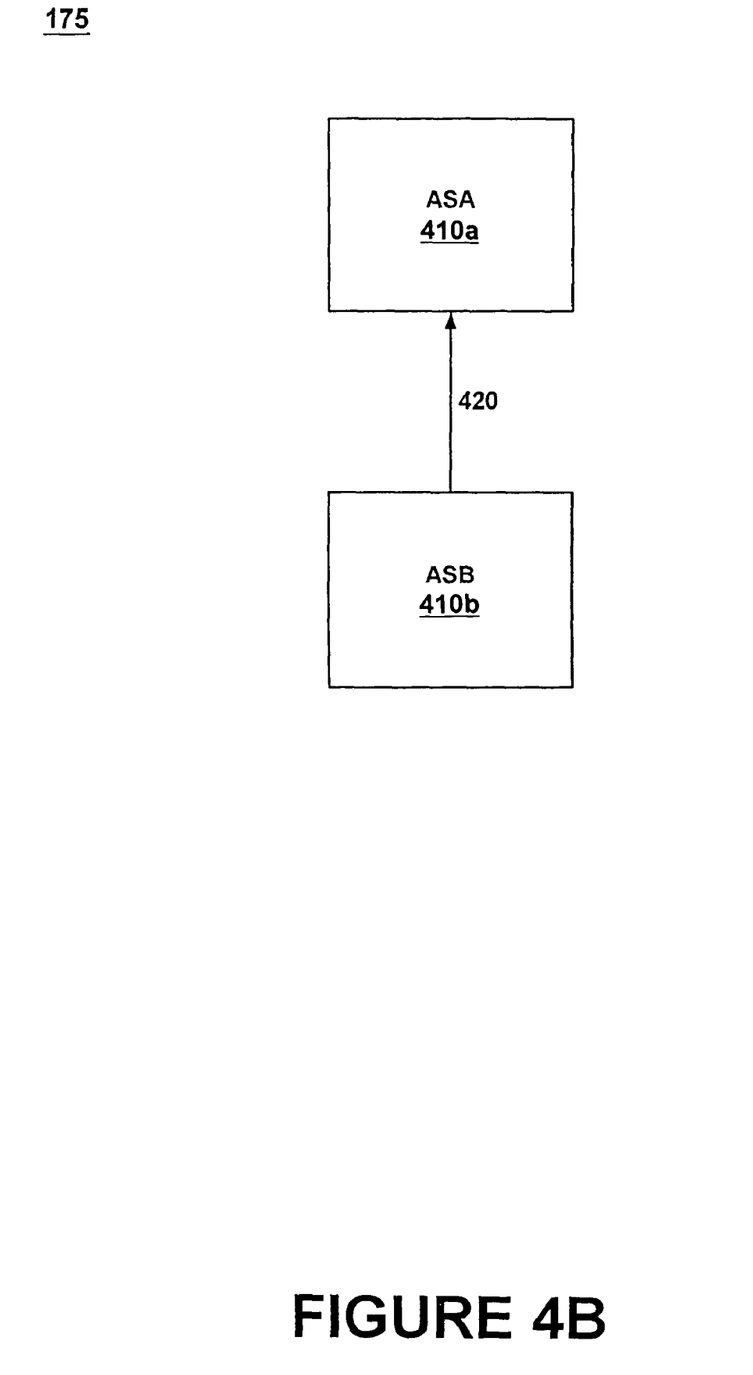

The above user module subgraph 175 may also be implemented with an analog ASA block 210a and analog ASB block 210b that are vertically aligned, as in FIG. 4B. In this case, the choice of which analog block 210 is on top may be arbitrary. Referring again to FIG. 2, the vertically oriented subgraph 175 of FIG. 4B may map to the hardware resource space in four other possible placements (ASA10, ASB20), (ASB11, ASA21), (ASA12, ASB22), (ASB13, ASA23).

A significance of the different orientations may be that a different cost is associated with placing a user module 170 that occupies two analog blocks 210 that are horizontally oriented, as compared to two analog blocks 210 that are vertically oriented. This difference in cost may relate to, for example, the way clocks are implemented. For example, some clocks may have a vertical distribution. Thus, if the user module 170 is implemented by two vertical analog blocks 210, the same clock may be used for both analog blocks 210. Furthermore, the clocks in the other three columns are free for other uses. However, if the user module 170 occupies two horizontal analog blocks 210, a clock from each column may need to be used. Further, the clocks in both columns may need to be configured alike. Hence, the vertical orientation may be favored. Thus, embodiments of the present invention may present the possible placements in the vertical orientation to the user. Further, the user may be notified of the cost considerations.

In some cases, the differences between the resources that are used by different implementation of a user module 170 may be more substantial. For example, an ND converter may be implemented in radically different ways. In one case, the A/D converter may use an interrupt when computing the digital value from analog input, which incurs processing load. In an alternative implementation, an additional digital block is used, which avoids using the interrupt. The two implementations may have different user module subgraphs 175. For example, different types of resources may be used (e.g., different PSoC™ blocks 210). Also, different connections may be used. The user may be presented the choice between the two implementations. Thus, the user is presented a selection between optimizing performance or saving resources (e.g., PSoC™ blocks 210). This implies that there may be multiple unique subgraphs 175 per user module 170.

Embodiments of the present invention annotate the target graph 165. For example, nodes and arcs may have associated therewith annotations that contain various information that is useful in configuring the hardware resource space. In one embodiment, the target space description 160 is initially written with nodes and/or arcs annotated. For example, an annotation may be used to facilitate the creation of a graphical structure that is displayed to a user of a program for developing a design in the underlying hardware. Other examples of annotations may be for describing whether a resource associated with that node is claimed or not. If the node is claimed, there may be a further annotation describing whether the claim is shared. Furthermore, the annotation may define what user module 170 has claimed the resource associated with the node.

In one embodiment, a cost may be assigned to one or more nodes such that when the subgraph isomorphism routine is executed a cost of using a resource connected to that node or arc may be calculated. In other embodiments, the target graph 165 is annotated during execution of the subgraph isomorphism routine. For example, information from a user module subgraph 175 or information that is entered from a computer terminal may be annotated to the target graph 165.

An embodiment of the present invention is a method of configuring a hardware resource space, using a subgraph isomorphism process. Steps of process 500 of FIG. 5 may be stored as instructions on a computer readable medium and executed on a general-purpose processor. The process 500 may be initiated as part of a design process in which a user is configuring a hardware resource space, such as a programmable system on a chip. For example, a program such as PSoC™ Designer Software Integrated Development Environment allows a user to select and place user modules 170 and to select parameters for the configuration. It will be clear to those of ordinary skill in the art that steps of process 500 may be performed in other orders and that some steps may be skipped.

Figure 5:
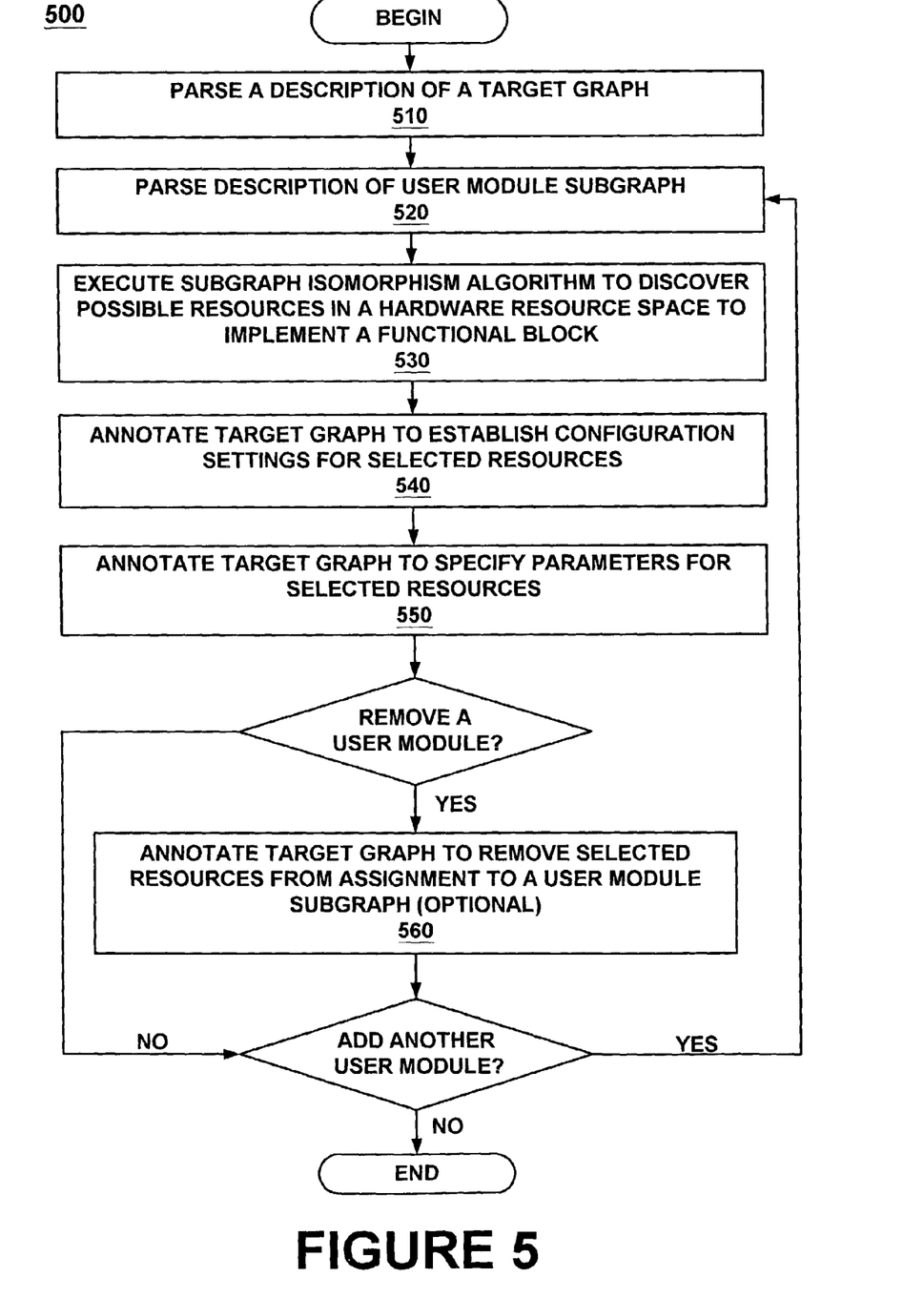
FIG. 5 is a flowchart illustrating steps of a process of configuring a hardware resource space, according to an embodiment of the present invention.

In step 510, a target space description 160 is parsed. This parsing produces a data structure that is suitable to apply a subgraph isomorphism process thereto. Step 510 may be optional if the target space description 160 is itself suitable to directly apply the subgraph isomorphism process.

In step 520, a description of a user module 170 is parsed. This parsing produces a file that is suitable to apply a subgraph isomorphism process thereto. Step 520 may be optional if the user module description 170 is itself suitable to directly apply the subgraph isomorphism process. Step 520 may be triggered by a user selecting a user module 170 to place in the hardware resource space. However, embodiments of the present invention are not limited to a user selecting a user module 170 for placement. For example, it may be that one or more user modules 170 are to be placed in the hardware resource space based on some predetermination.

In step 530, the subgraph isomorphism process is applied to determine embeddings of the user module subgraph 175 into the target graph 165. In this fashion, possible placements for a user module 170 in a hardware resource space are discovered. Unlike conventional techniques, this embodiment may discover multiple possible placements of the user module 170.

The possible placements may be divided between legal placements and available placements, depending upon the availability of resources that are needed. An available placement may be defined as a portion of the hardware resource space that is suitable to implement the desired user module 170 (e.g., the user module subgraph 175 embeds into the target graph 165) and for which the necessary resources are available. A legal placement indicates there is at least one conflict over resources with resources presently claimed by another user module 170. As discussed herein, the resources may be shared by user modules 170.

Moreover, the possible placements may be ordered and presented to the user according to the ordering. For example, when placing a user module 170 in the analog array shown in FIG. 2, there may be a different cost associated with placing a user module 170 that occupies two analog blocks 210 that are horizontally oriented than two analog blocks 210 that are vertically oriented.

Another example of providing cost information to the user may occur when user module 170 maps to a resource that has more functionality than is needed when a simpler resource is available. For example, there may be digital PSoC™ blocks the perform a communication function which others are unable to perform. A given user module 170 may be able to use any digital PSoC™ block, although it does not need the communication function. Hence, if the user module 170 is placed on a digital communication PSoC™ block, that special functionality is wasted. Thus, the user may be warned against placing the user module 170 in that position. Embodiments of the present invention annotate the user module graph 175 and/or the target graph 165 with information that may be used to determine that a warning is warranted.

In step 540, the target graph 165 is annotated to establish configuration settings for selected resources. This step may be taken in response to a user selecting a placement for a user module 170. Alternatively, this step may be taken without user intervention. For example, the process 500 may automatically place the user module 170 in accordance with predetermined criteria for placing the user module 170.

The configuration settings may relate to connections between various resources, such as, for example, two analog PSoC™ blocks 210. Step 540 may involve transferring over information to the target graph 165 from the user module subgraph 175 that was just placed. For example, the exemplary simplified description for a user module 170 shown in FIG. 3 has an input list tag 320 that describes the connection between the MSB block and the LSB block. The target graph 165 may be annotated with this information.

In step 550, the target graph 165 is annotated to specify parameters for selected resources. For example, a user may specify the gain of an amplifier implemented by a user module 170. In one embodiment, the user is presented with a graphical interface having various parameter options from which to select.

Process 500 allows for user modules 170 to be removed from the target space. If the user decides to remove a user module 170 completely or to merely move it to another location after it has already been placed, then step 560 is taken. In optional step 560, the target graph 165 is annotated to remove selected resources from their assignment to a user module 170.

In one embodiment, the annotation to the target graph 165 that assigned a resource to a user module 170 is accomplished by storing a pointer or the like in the target graph 165. The pointer may point to the user module 170 to which the resource is assigned. The user module 170 may also have a pointer to the resource in the target graph 165. Thus, in step 560 the pointers may be reset to null to free up the resource.

If there are more user modules 170 to add to the hardware resource space, then process 500 returns to step 520. This may occur in response to a user selecting another user module 170 for placement or may occur automatically if a predetermined set of user modules 170 were to be placed automatically in the hardware resource space.

When there are no more user modules 170 to place and all the necessary configuration and parameterization has been completed, process 500 ends. The target graph 165 now has a complete description of the user's design. This may be downloaded to a device to be simulated. Alternatively, the design may be downloaded to an actual device to program the device using the information stored in the target graph 165. For example, the annotations in the target graph 165 may be used to set register values or the like to configure the actual hardware.

Figure 6:
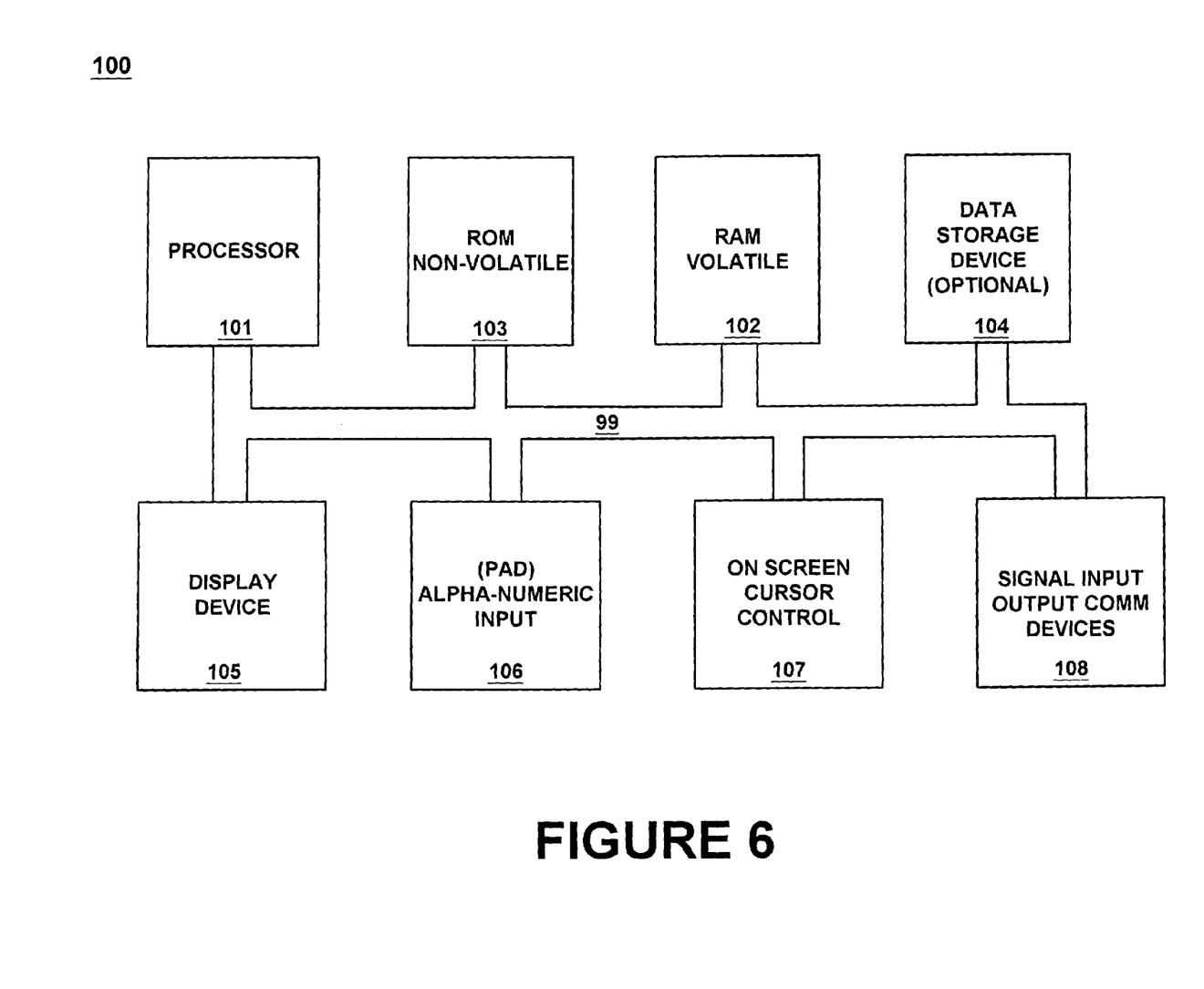
FIG. 6 is a computer system that may serve as a platform upon which embodiments of the present invention may be executed.

FIG. 6 illustrates circuitry of computer system 100, which may form a platform for embodiments of configuring a hardware resource space, using a subgraph isomorphism process. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 6, system 100 of the present invention also includes an optional alphanumeric input device 106 including alphanumeric and function keys is coupled to bus 99 for communicating information and command selections to central processor unit 101. System 100 also includes a cursor control device 107 coupled to bus 99 for communicating user input information and command selections to central processor unit 101. The user may thus use a cursor or keypad to input select, place, and parameterize user modules 170. System 100 of the present embodiment also includes a display device 105 coupled to bus 99 for displaying information. For example, a graphical display of the hardware resource space may be displayed. A signal input/output communication device 108 coupled to bus 99 provides communication with external devices.

The preferred embodiment of the present invention, a method and system for configuring a hardware resource space using a subgraph isomorphism process, is thus described. While the present invention has been described in particular embodiments, it should be appreciated that the present invention should not be construed as limited by such embodiments, but rather construed according to the below claims.

What is claimed is:

1. A method of defining a configuration of hardware resources, comprising:
   a) executing, in a processing device, a subgraph isomorphism process to discover multiple sets of available resources in a programmable hardware resource space of an integrated circuit, each discovered set of available resources comprising semiconductor features to perform transformation of inputs to outputs for implementing a particular user module function, and to discover multiple available target placements of the discovered sets of available resources in the hardware resource space, wherein said hardware resource space is defined by a target graph, and wherein said user module is defined by a subgraph;
   b) in response to a selection of one of said multiple sets of available resources to implement the particular user module function together with selection of one of said multiple available placements, establishing configuration settings relating to connections between individual resources in the selected set of resources according to the selected placement by annotating said target graph, said configuration settings based on said subgraph mapping to said target graph and annotating said target graph to describe a way in which said user module will share resources in said selected set of resources;
   c) in response to receiving parameters for implementing said user module function, specifying attributes and operating parameters for particular ones of the selected set of resources by annotating said target graph to generate an annotated target graph; and
   d) sequentially repeating said a) through said c) for additional user modules defined by additional subgraphs, to provide a configuration of said hardware resource space to implement an integrated circuit design by superposing said subgraph and said additional subgraphs on said target graph.

2. The method of claim 1, wherein said available resources comprise available placements that do not conflict with placements of other user modules and legal placements that do conflict with placements of other user modules.

3. The method of claim 1, wherein said b) comprises annotating said target graph to assign said selected set of resources to said user module.

4. The method of claim 3, further comprising:
   e) annotating said target graph to remove said selected resources from said assignment to said user module.

5. The method of claim 1, wherein said a) comprises:
   a1) calculating a figure of merit for more than one of said available resources, based on cost annotations within said target graph; and
   a2) ordering said available resources from said a1) based on said calculated figure of merit.

6. The method of claim 1, wherein:
   said subgraph and said additional subgraphs comprise a plurality of unique subgraphs that each define said user module, said unique subgraphs claiming different available resources in said hardware resource space from each other; and
   said step a) further comprises executing said subgraph isomorphism process to find embeddings for each of said plurality of subgraphs in said target graph to discover available resources in said hardware resource space to implement said user module.

7. The method of claim 1, wherein said target graph is also annotated to indicate which of the available sets of resources has been selected by a user module.

8. The method of claim 1, wherein said target graph is also annotated to identify a user module that has selected a particular set of resources.

9. A computer readable non-transitory medium having stored thereon instructions which when executed on a processor executes a method of defining a configuration of hardware resources, said method comprising:
   a) executing a subgraph isomorphism process to discover multiple sets of possible resources in a programmable hardware resource space, each set for implementing a particular user module, wherein said hardware resource space is defined by a target graph, wherein said user module is defined by each of multiple unique subgraphs, and wherein said different sets of resources include locations that individual ones of said unique subgraphs embed in said target graph;
   b) accessing a selected one of said multiple sets of resources to implement the particular user module function and selecting placements of individual resources in the selected set of resources;
   c) annotating said target graph to establish configuration settings for said selected set of resources to generate an annotated target graph and annotating said target graph to describe a way in which said user module will share resources in said selected set of resources, wherein said annotating is based on placements that said subgraphs associated with the selected set of resources embed in said target graph;
   d) in response to a user input, further annotating said annotated target graph to specify parameters for individual resources in said selected set of resources and for implementing one or more functions of said user module; and
   e) repeating said a) through said d) for additional user modules defined by additional subgraphs, wherein a configuration of said hardware resource space comprises the combination of where said subgraph and said additional subgraphs embed on said annotated target graph.

10. The computer readable medium of claim 9, wherein said c) of said method comprises annotating said target graph with resource sharing information.

* * * * *